United States Patent
Okabe et al.

[11] Patent Number: 6,100,140
[45] Date of Patent: *Aug. 8, 2000

[54] MANUFACTURING METHOD OF SEMICONDUCTOR DEVICE

[75] Inventors: Naoto Okabe, Chita-gun; Tsuyoshi Yamamoto, Chiryu; Mitsuhiro Kataoka, Kariya, all of Japan

[73] Assignee: Nippondenso Co., Ltd., Kariya, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/675,774

[22] Filed: Jul. 3, 1996

[30] Foreign Application Priority Data

Jul. 4, 1995 [JP] Japan ................................ 7-168821

[51] Int. Cl.[7] .................................................. H01L 21/336
[52] U.S. Cl. .......................... 438/270; 438/268; 438/138; 438/585; 438/589
[58] Field of Search ..................................... 438/268, 270, 438/269, 271, 272, 273, 274, 301, 305, 143, 476, 138, 585, 589; 148/DIG. 126

[56] References Cited

U.S. PATENT DOCUMENTS

| | | | |
|---|---|---|---|
| 3,494,809 | 2/1970 | Ross | 438/357 |
| 4,053,335 | 10/1977 | Hu | 148/DIG. 37 |
| 4,417,385 | 11/1983 | Temple | 438/281 |
| 5,242,862 | 9/1993 | Okabe et al. | 438/268 |
| 5,296,385 | 3/1994 | Moslehi et al. | 438/474 |
| 5,342,797 | 8/1994 | Sapp et al. | 148/DIG. 126 |
| 5,360,748 | 11/1994 | Nadahara et al. | 148/DIG. 60 |
| 5,460,985 | 10/1995 | Tokura et al. | 148/DIG. 126 |
| 5,470,770 | 11/1995 | Takahashi et al. | 148/DIG. 126 |

FOREIGN PATENT DOCUMENTS

| | | |
|---|---|---|
| 373723 | 6/1990 | European Pat. Off. ...... 438/FOR 176 |
| 550 770 | 7/1993 | European Pat. Off. . |
| 62-12167 | 1/1987 | Japan . |
| 93/03502 | 2/1993 | WIPO . |

*Primary Examiner*—Michael Trinh
*Attorney, Agent, or Firm*—Pillsbury Madison & Sutro LLP

[57] ABSTRACT

A manufacturing method of a vertical type MOSFET, which can suppress vaporization of impurity from a semiconductor substrate and prevent variation in carrier density of the channel, is disclosed. The vertical type MOSFET is formed by forming a local oxide film to form a concavity on the element surface, removing the local oxide film by wet-etching technique, forming the gate oxide film at the sidewall of the concavity by thermal oxidation, and forming a gate electrode. Further, a polycrystalline silicon is formed on a back surface of the semiconductor substrate before removing the local oxide film. Accordingly, since the polycrystalline silicon is not removed when removing the local oxide film, vaporization of impurity from the semiconductor substrate is suppressed during the thermal oxidation for forming the gate oxide film, thereby preventing change in the carrier density of the channel.

19 Claims, 7 Drawing Sheets

MANUFACTURING METHOD OF SEMICONDUCTOR DEVICE

CROSS REFERENCE TO RELATED APPLICATION

This application is based upon and claims the benefit of priority of the prior Japanese Patent Application No. 7-168821 filed on Jul. 4, 1995, the contents of which are incorporated herein by reference.

BACKGROUND OF THE INVENTION

1. Field of the Invention

The present invention generally relates to a manufacturing method for a semiconductor device. More particularly, the present invention relates to a manufacturing method for a semiconductor device used as a power semiconductor device, e.g., a vertical MOSFET (metal oxide semiconductor field effect transistor) and an IGBT (insulated gate bipolar transistor), and can suitably be employed for a single unit power semiconductor device or a MOS-IC including such power semiconductor device.

2. Related Arts

As for a conventional semiconductor device which remarkably reduces the ON-resistance per area, a vertical type MOSFET having a concavity on the surface thereof and a channel region disposed at the sidewall surface of the concavity has been disclosed in the International Publication No. PCT The concavity of the proposed device is fabricated by a combination of local oxidation of silicon (LOCOS) technique and chemically etching off the formed thick oxide film using wet etching. That is to say, before removing the thick oxide film, a body region and a source region for each cell are formed by using the thick oxide film as a double diffusion mask so as to self-align with the side of the thick oxide film, and then a gate insulating film and a gate electrode are formed in the concavity after removing the thick oxide film.

SUMMARY OF THE INVENTION

However, when actually manufacturing such vertical type MOSFET, following problems are raised. Unlike the conventional planar type MOS structure whose channel region is positioned after oxidizing and arranging the gate, as mentioned above, the channel region of the proposed vertical type device is firstly defined by the double diffusion, and secondly wet etching of the thick oxide film is performed to form the concavity, and then the surface of the concavity is oxidized to form the gate insulating film.

Accordingly, the by-product oxide layer, formed at the back surface side of the substrate simultaneously with forming oxide film such as LOCOS oxide film etc. on the substrate, is removed at the same time of wet etching the above-mentioned thick oxide film (LOCOS oxide film) so that the back surface of the substrate is exposed. At this point, since the back surface of the power semiconductor element substrate is highly doped regardless of the type of semiconductor element, during the subsequent gate oxidation step, impurities are vaporized and then scattered from the exposed back surface of the substrate and reintroduced to the substrate main surface where the channel region has been defined. This results in a fluctuation, or a drop, for example, of the carrier density of the channel region, affecting the electric characteristics of the element. More concretely, this problem causes the threshold voltage to be out of the design value, degrading the wafer uniformity in the threshold value, and causing withstand voltage failure between drain and source.

This kind of problems occurs not only to the vertical type MOSFET disclosed in the above-mentioned PCT WO93/03502, but also to the trench gate type vertical MOSFET having a trench formed by means of R.I.E. (reactive ion etching) technique. Namely, when trench forming, $SiO_2$ is generally deposited as a trench mask on the substrate surface, and simultaneously by-product oxide film is deposited on the back surface of the substrate. Since this $SiO_2$ of the back surface of the substrate is removed at the same time when removing the $SiO_2$ as a trench mask after the trench is formed, the same problems as mentioned above is assumed to occur to the trench gate type vertical MOSFET.

In view of the above problems, it is a primary object of the present invention to provide a manufacturing method for a semiconductor device which can solve the problems of carrier density fluctuation due to the scattering of impurities from the back surface of the substrate in the step of heat treatment applied to the substrate after defining the channel region.

The manufacturing method according to the present invention comprises: defining a channel region by disposing, on a semiconductor substrate having a first conductivity type semiconductor layer of low impurity concentration on a main surface thereof, a second conductivity type body region and a first conductivity type source region; covering a back surface of the semiconductor substrate with masking material; forming a gate insulating film by oxidizing the surface of the channel region; and arranging a gate electrode in correspondence with the channel region with the gate insulating film interposed therebetween.

According to the above-mentioned manufacturing method, although the channel region is exposed during the gate oxidation, the high concentrated region of the back surface of the substrate is still covered by the masking material.

Therefore, by means of the masking material, the vaporization and scattering of the impurities from the back surface of the semiconductor substrate can be prevented, and the undesired fluctuation of the carrier density at the channel region due to the vaporization and scattering of the impurities can be also prevented. Hence the element characteristics can be prevented from being varied.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

An embodiment according to the present invention will now be described referring to the appended drawings.

Figure 1A:
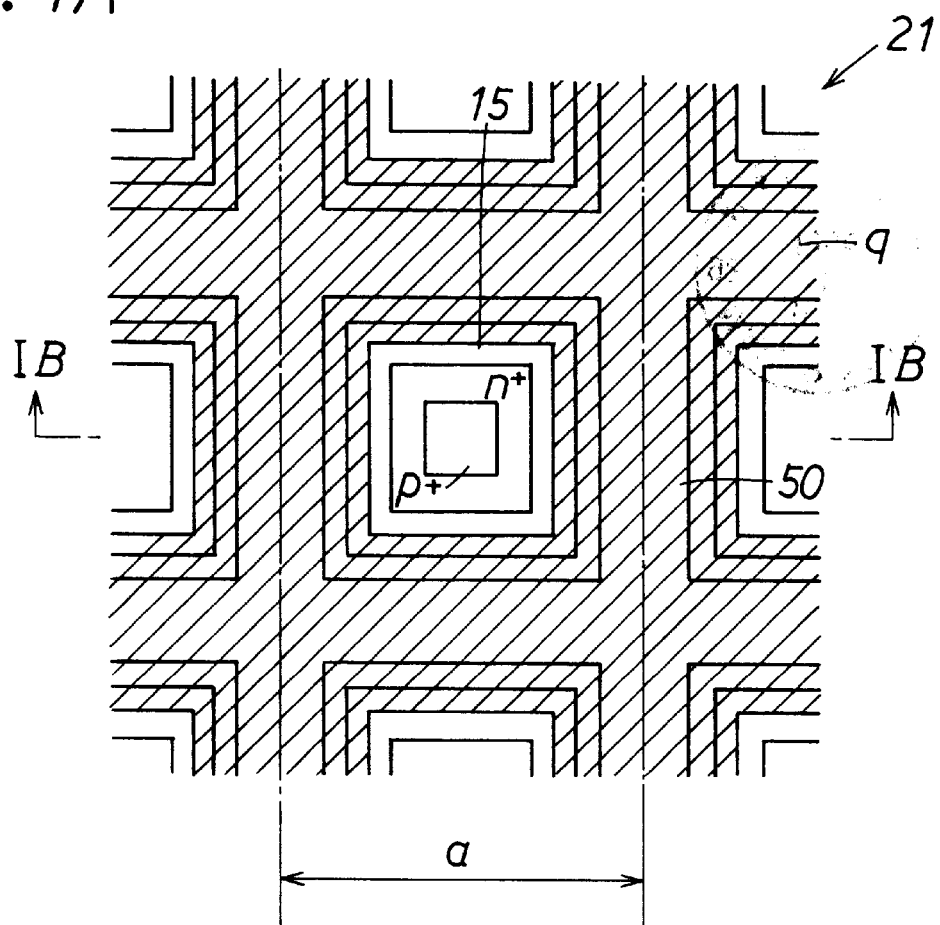
FIG. 1A is a plane view illustrating a part of the vertical type power MOSFET according to an embodiment of the present invention.
Figure 1B:
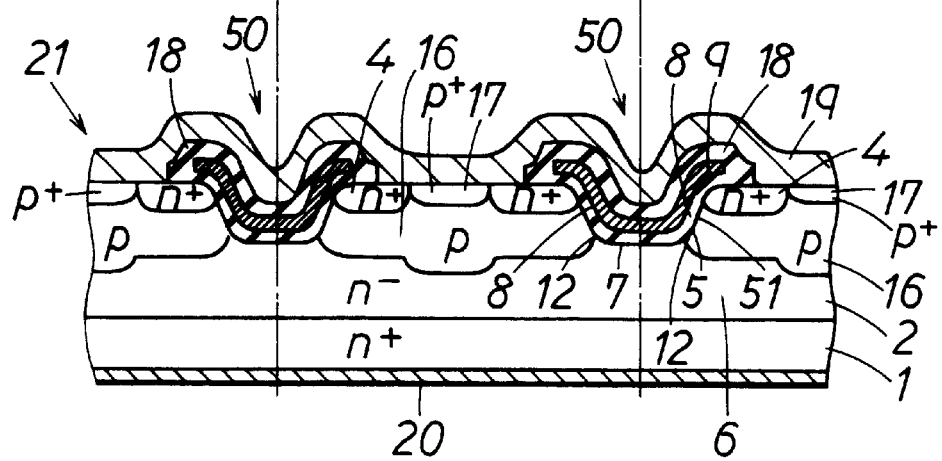
FIG. 1B is a cross-sectional view taken along line 1B—1B of FIG. 1A.

FIG. 1A is a plane view of a vertical type power MOSFET according to the embodiment of the present invention, and FIG. 1B is a cross-sectional view taken along line 1B—1B of FIG. 1A.

The main part (unit cell part) of the vertical type power MOSFET according to this embodiment is so constructed as illustrated in FIGS. 1A and 1B in which numerous unit cells 15 are laid out lengthwise and breadthwise at a pitch (unit cell dimension) of a.

In FIGS. 1A and 1B, a wafer 21 is composed of a semiconductor substrate 1 consisting of n$^+$-type silicon having an impurity concentration of approximately $10^{20}$ cm$^{-3}$ and a thickness of 100–300 μm, and an n$^-$-type epitaxial layer 2 having an impurity concentration of approximately $10^{16}$ cm$^{-3}$ and a thickness of approximately 7 μm formed on semiconductor substrate 1, and as described above, numerous unit cells 15 are regularly laid out on the main surface of wafer 21.

On the main surface of wafer 21 is formed a local oxide film to a thickness of approximately 3 μm to form a U-groove (i.e., concave structure) 50 at a pitch of the unit cell dimension a (=approximately 12 μm) and by diffusion self-alignment using this oxide film as a double diffusion mask are formed a p-type body region 16 to a junction depth of approximately 3 μm and an n$^+$-type source region 4 to a junction depth of approximately 1 μm, whereby a channel 5 is defined on a sidewall part 51 of U-groove 50.

Incidentally, p-type body region 16 is set to a junction depth which does not permit p-type region 16 to be fractured due to breakdown at an edge part 12 on the bottom of U-groove 50. Furthermore, boron ions have been diffused into the central part of p-type body region 16 beforehand to deepen the junction depth in the central part of p-type region 16 down from the circumference, so that a breakdown can be caused when a high voltage is applied between the drain electrode and the source electrode.

After the double diffusion, the local oxide film, which is used for forming U-groove 50 as well as for the diffusion mask, is removed, a gate oxide film 8 is formed to a thickness of approximately 60 nm on the inner wall of U-groove 50 and on gate oxide film 8 are formed a gate electrode 9 with polysilicon to a thickness of approximately 400 nm and an interlayer insulating film 18 with borophosphosilicate glass (BPSG) to a thickness of approximately 1 μm.

Furthermore, a p$^+$-type body contact region 17 is formed to a junction depth of approximately 0.5 μm in the central part surface of p-type body region 16 and ohmic contact is made between a source electrode 19 formed on interlayer insulating film 18 and n$^+$-type source region 4 and p$^+$-type body contact region 17 through a contact hole. On the other hand, a drain electrode 20 is formed commonly on the back surface of semiconductor substrate 1 to make ohmic contact therewith.

Reference numeral 6 denotes an n$^-$-type drain layer, and reference numeral 7 denotes JFET portion.

An example of the manufacturing method according to the present embodiment will now be described.

Figure 2:
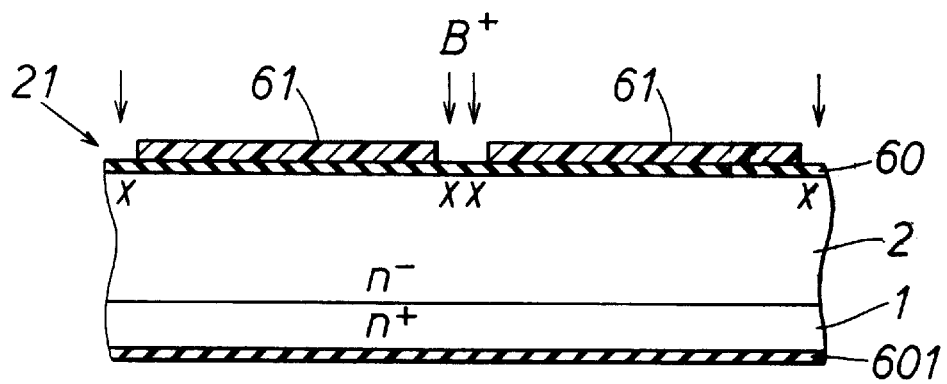
FIGS. 2 through 9 are cross-sectional views illustrating the manufacturing processes of the important parts of the vertical type power MOSFET according to the embodiment of the present invention.

A wafer 21 is prepared in which, as illustrated in FIG. 2, an n$^-$-type epitaxial layer 2 is formed by means of homoepitaxial growth on the main surface of n$^+$-type silicon substrate 1. The thickness of epitaxial layer 2 is approximately 7 μm and the impurity concentration thereof is approximately $10^{16}$ cm$^{-3}$. A pad oxide film 60 is formed to a thickness of approximately 60 nm by thermally oxidizing the main surface of wafer 21 and simultaneously, an oxide film 601 is also formed on the back surface of semiconductor substrate 1.

Subsequently, a photoresist film 61 is deposited on pad oxide film 60 and photoresist film 61 is patterned to form a pattern opened in the central part of a region where a cell is to be formed by means of well-known photolithographic techniques. Then, boron ions (B$^+$) are implanted into epitaxial layer 2 by using photoresist film 61 as a mask.

Figure 3:
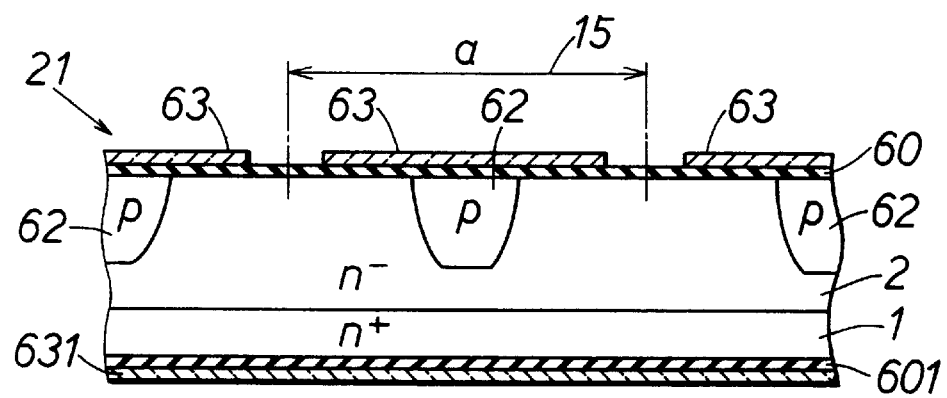

As illustrated in FIG. 3, after removing photoresist film 61, a p-type diffusion region 62 is formed to a junction depth of approximately 3 μm by means of thermal diffusion. This p-type diffusion region 62 ultimately constitutes a part (deep well region) of p-type body region (described later) and plays a role of improving the surge resistance of the device by stably causing a breakdown at the bottom part of p-type diffusion region when a high voltage is applied to between the drain electrode and the source electrode.

A silicon nitride film 63 is deposited to a thickness of approximately 200 nm on the main surface of wafer 21 by means of CVD (Chemical Vapor Deposition) method, while a silicon nitride film 631 is formed on the back surface of semiconductor substrate. Then, silicon nitride film 63 is patterned to form a lattice-like open pattern opening at a pitch of a (dimension of unit cell 15). During the formation of this open pattern, mask-alignment is conducted so that the above p-type diffusion region 62 can be positioned in the central part of the pitch.

Figure 4:
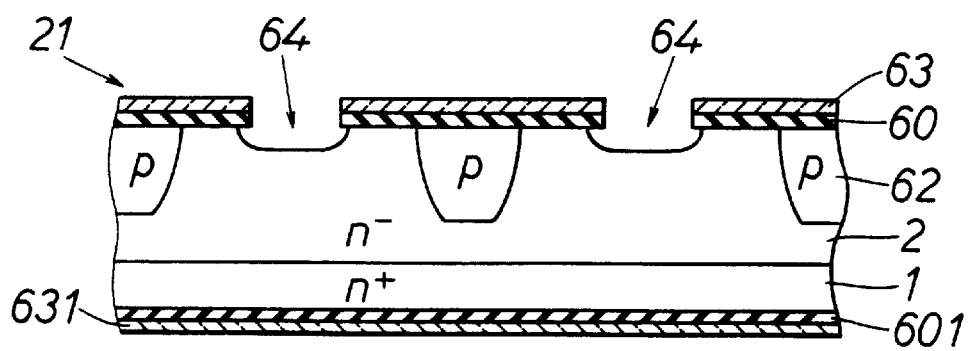

As illustrated in FIG. 4, pad oxide film 60 is then etched using silicon nitride film 63 as a mask. Following this, an initial groove 64 is formed by etching n$^-$-type epitaxial layer 2 to a depth of 1.5 μm. In the present embodiment, initial groove 64 is isotropically formed by means of chemical dry etching method.

Figure 5:
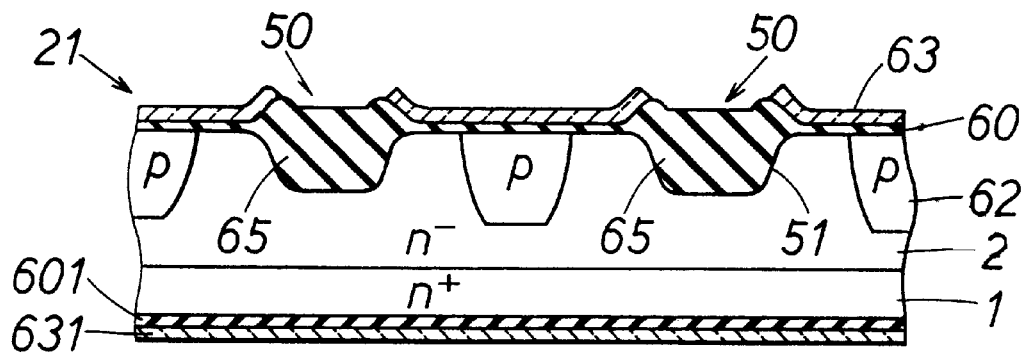

Next, as illustrated in FIG. 5, the part of groove 64 is thermally oxidized using silicon nitride film 63 as an oxidation mask. This is an oxidation method applying the well known LOCOS (local oxidation of silicon) method. By this oxidation, a LOCOS oxide film 65 is formed on the surface of wafer 21, and concurrently the shape of a U-groove 50 (concave structure) is defined by erosion of the surface of n$^-$-type epitaxial layer 2 due to the growth of LOCOS oxide film 65.

Figure 6:
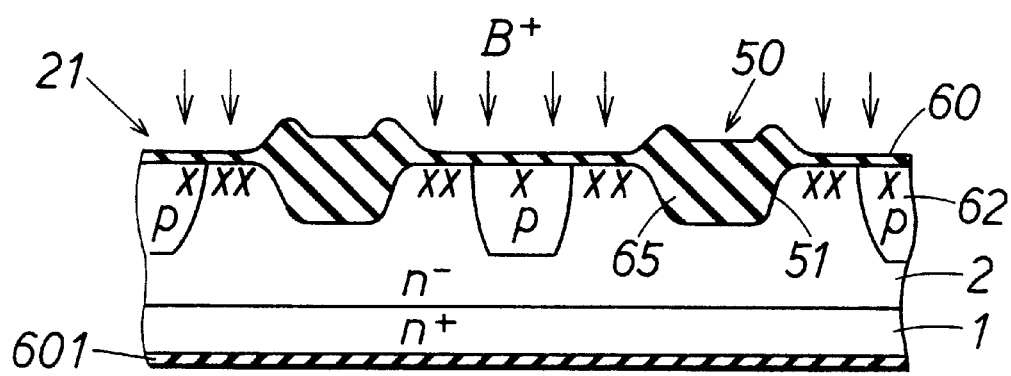

As shown in FIG. 6, silicon nitride film 63 is immersed in heated phosphoric acid solution or the like for wet-etching. Accordingly, silicon nitride film 631 on the back surface of semiconductor substrate is simultaneously removed. Then, boron ions are implanted through the thin pad oxide film 60 using LOCOS oxide film 65 as a diffusion mask. At this time, the boundary part between LOCOS oxide film 65 and pad oxide film 60 constitutes a self-alignment position to exactly define a region into which boron ions are implanted.

Figure 7:
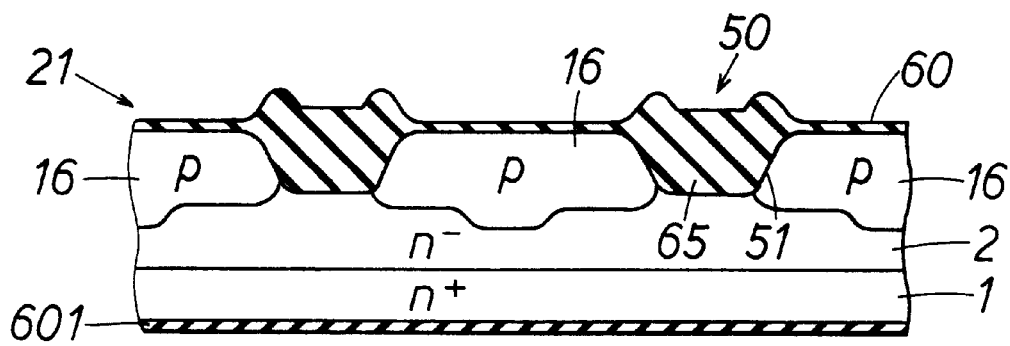

Then, as illustrated in FIG. 7, thermal diffusion is applied to diffuse the implanted boron ions into epitaxial layer 2 to a junction depth of approximately 3 μm. As a result of this thermal diffusion, p-type diffusion region 62 previously formed in the process illustrated in FIG. 3 and the boron diffusion region (channel well region) into which boron ions have been implanted in the process illustrated in FIG. 6 are integrated into p-type body region 16, both ends of which are self-aligned and defined by the positions of the sidewalls of the U-groove 50.

Figure 8:
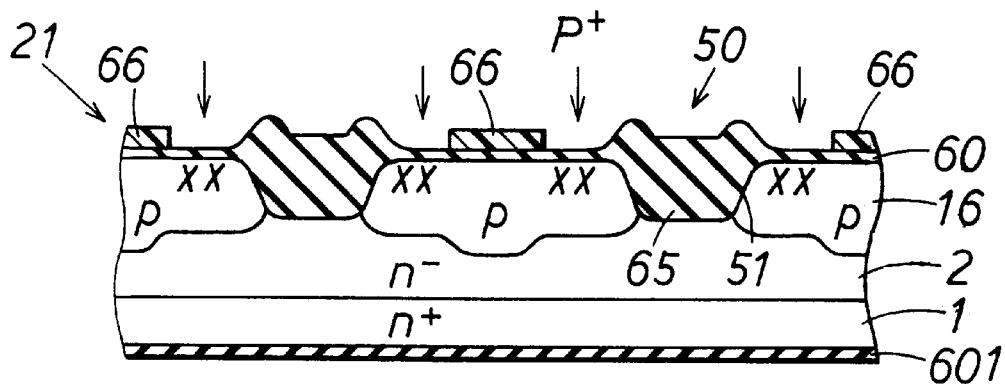

Subsequently, as illustrated in FIG. 8, after forming a photoresist film 66 which is patterned so as to cover the central part of the surface of p-type body region 16 surrounded by LOCOS oxide film 65, phosphorous ions are implanted through thin pad oxide film 60 using photoresist film 66 and LOCOS oxide film 65 as a diffusion mask to form an $n^+$-type source region 4. In this process, like the process illustrated in FIG. 6 in which boron ions have been implanted, the boundary part between LOCOS oxide film 65 and pad oxide film 60 constitutes a self-alignment position, whereby the ion implantation region can exactly be defined.

Figure 9:
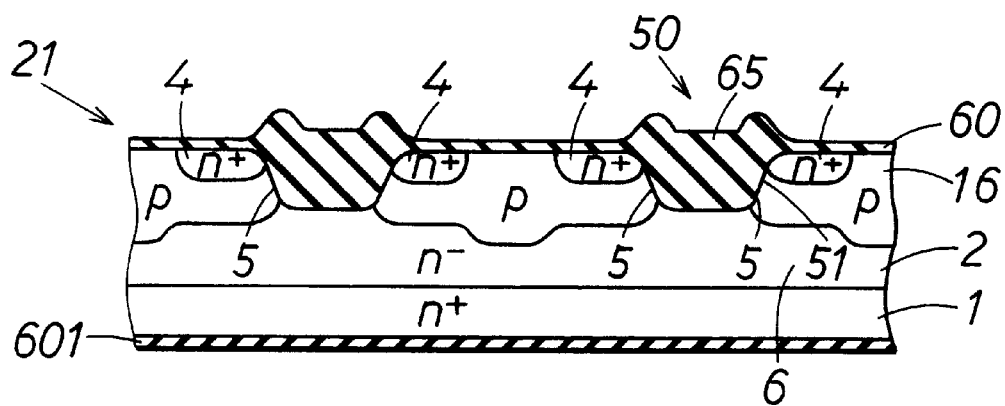

The next process is, as illustrated in FIG. 9, to apply thermal diffusion to form $n^+$-type source region 4 of approximately 0.5~1 μm in junction depth and define a channel 5 as well. The end surface being in contact with U-groove 50 in the region of $n^+$-type source region 4 is self-aligned and defined in the position of the sidewall of U-groove 50.

The processes illustrated in FIGS. 6 to 9 fix the junction depths and shapes of p-type body region 16 and $n^+$-type source region 4 and define the channel region.

Figure 10:
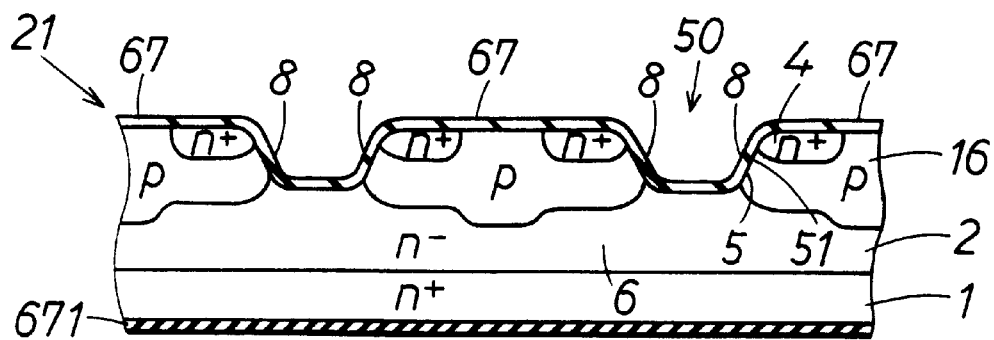
FIG. 10 is a cross-sectional view illustrating the gate oxidizing step consequent to the step illustrating in FIG. 9 based on the conventional manufacturing process of the vertical type power MOSFET.

According to the conventional manufacturing methods disclosed in the above International Publication No. PCT WO93/03502, LOCOS oxide film 65 is then removed by wet-etching so that inner wall 51 of U-groove 50 is exposed, whereupon as illustrated in FIG. 10, gate oxide film 8 is formed to a thickness of approximately 60 nm by thermal oxidation.

As mentioned above, when LOCOS oxide film 65 is removed by wet-etching, the oxide film 601 on the other main surface of semiconductor substrate 1, or on the back surface of the substrate, is simultaneously removed by etching so that the back surface of semiconductor substrate 1 is exposed. Therefore, there is a problem that the impurities which are vaporized from the exposed back surface of the semiconductor substrate 1 is introduced into the surface of semiconductor layer. Accordingly, when the vaporized impurities are introduced into channel 5 which is exposed after the removal of LOCOS oxide film 65, the acceptor density of channel 5 is compensated, resulting in a drop in carrier density of channel 5. This causes problems as influences on the electric characteristics of the element such as lowering of the threshold voltage unexpectedly lower than the predetermined value, degrading the wafer uniformity in the threshold voltage, and causing poor withstand voltage between the drain electrode and the source electrode. It is to be noted that reference numeral 671 in FIG. 10 denotes an oxide film grown at the same time of forming gate oxide film 8.

Figure 11:
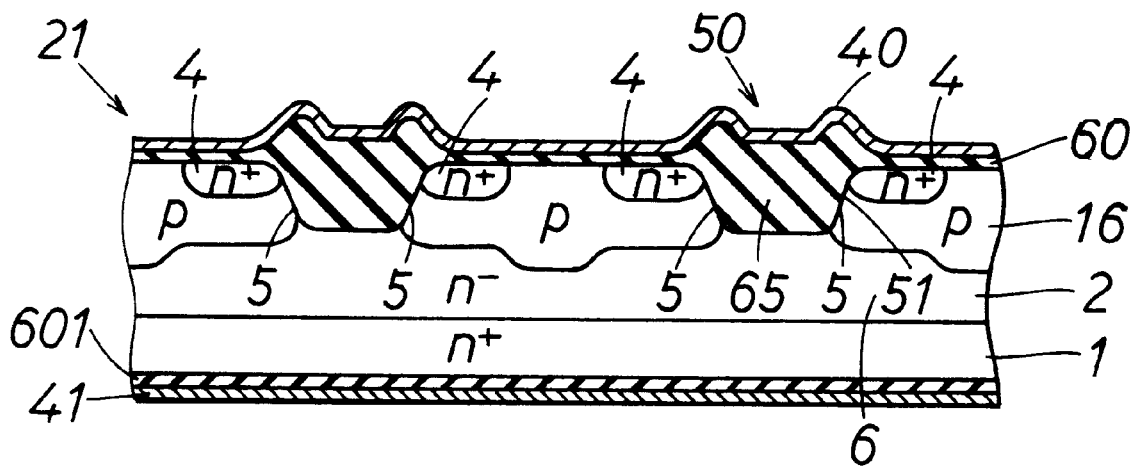
FIGS. 11 to 18 are a cross-sectional views illustrating the manufacturing processes of the important parts of the vertical type power MOSFET consequent to the step illustrating in FIG. 9 according to the embodiment of the present invention.
Figure 12:
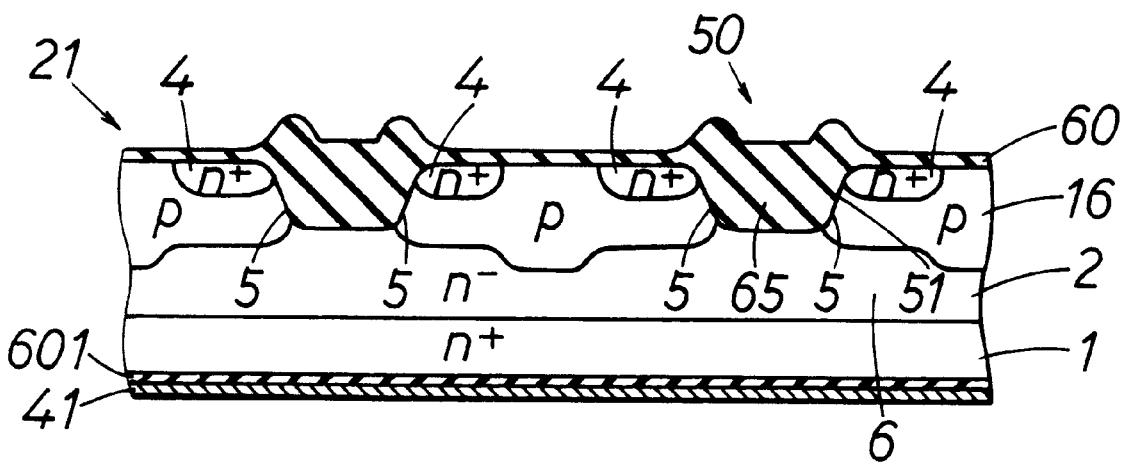

On the other hand, according to the manufacturing method of the invented embodiment, after the ion implantation using LOCOS oxide film 65 as a mask and thermal diffusion to form $n^+$-type source region 4 as illustrated in FIG. 9, polycrystalline silicon films 40 and 41 are intentionally formed to a thickness of 400 nm by means of CVD method as illustrated in FIG. 11, then polycrystalline silicon film 40 on the surface side of semiconductor layer 2 is selectively removed by R.I.E. (Reactive Ion Etching) method as illustrated in FIG. 12.

Figure 13:
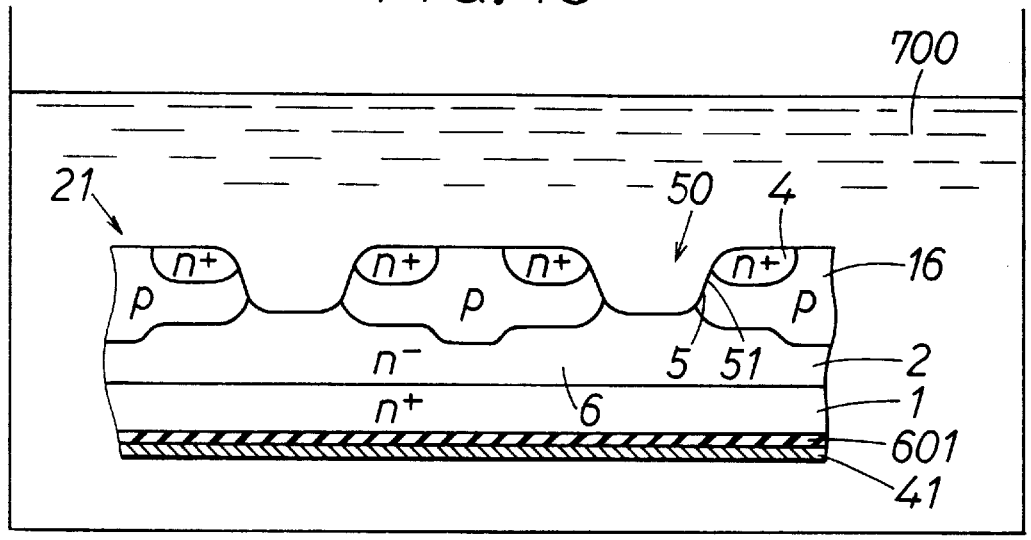

Next, as illustrated in FIG. 13, an inside wall 51 of U-groove 50 is exposed by removing LOCOS oxide film 65 by way of terminating the silicon surface with hydrogen within an aqueous solution 700 containing hydrofluoric acid and adjusted to an acidity/alkalinity of around pH5 with ammonium fluoride. At this point, since the back surface of wafer 21 is covered with polycrystalline silicon film 41, oxide film 601 remains unremoved.

After the completion of the above process, the wafer 21 is taken out of the aqueous solution and dries in a clean air.

Figure 14:
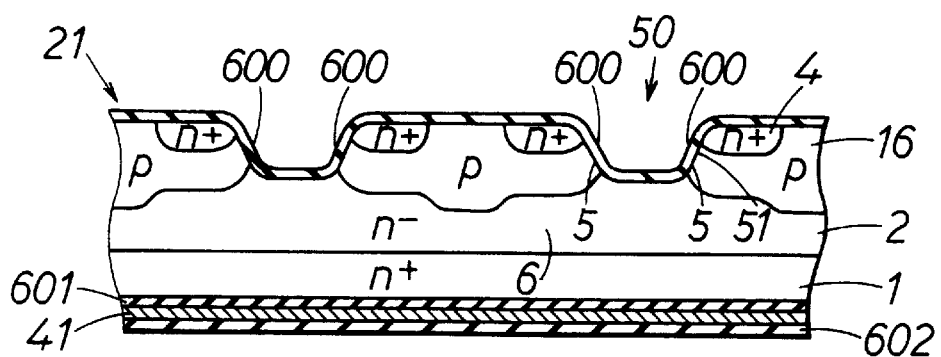

Then, as illustrated in FIG. 14, a temporary oxide film 600 is formed on a side surface 51 of U-groove 50 of p-type body region 16 on which channel 5 is to be formed. By this thermal oxidation process, the flatness of the surface on which channel 5 is to be formed is improved in terms of atomic order. This thermal oxidation process is performed by slowly inserting a wafer boat holding a plural number of wafers 21 into an oxidation furnace which is maintained within the oxygen atmosphere at a temperature of approximately 1,000° C.

Since the back surface of wafer 21 is covered with oxide film 601 and polycrystalline silicon film 41, the scattering of impurities within semiconductor substrate 1 of high impurity concentration to the outside of wafer 21 during the thermal oxidation process can be controlled. Therefore, channel 5 of any wafer in the oxidation furnace is prevented from being doped with impurities. Further, in the thermal oxidation process illustrated in FIG. 14, the surface of polycrystalline silicon film 41 is simultaneously oxidized to form an oxide film 602.

Then, temporary oxide film 600 is removed. The removal of this temporary oxide film 600 is also performed while terminating the exposed silicon surface with hydrogen within an aqueous solution containing hydrofluoric acid and adjusted to an acidity/alkalinity of around pH5 with ammonium fluoride. Inside wall 51 of U-groove 50 formed by this method is a good silicon surface with a high flatness and a few defects. In this process, oxide film 602 at the back surface of the wafer is also removed by etching, while oxide film 601 remains unremoved because oxide film 601 is covered by polycrystalline silicon film 41.

Figure 15:
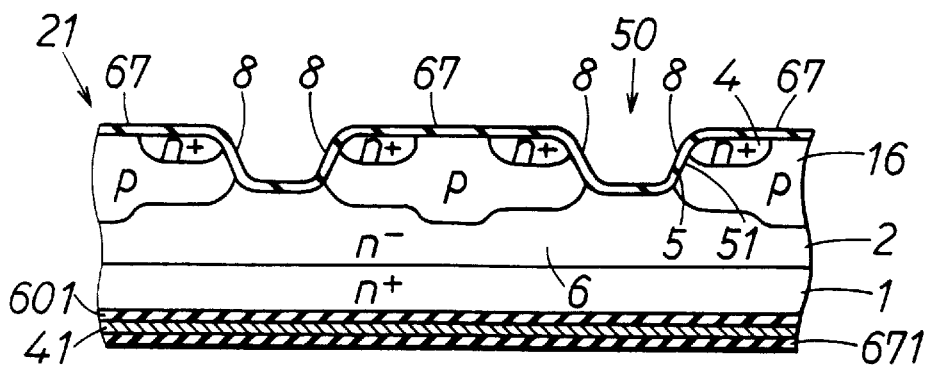

As illustrated in FIG. 15, a gate oxide film 8 is then formed to a thickness of approximately 60 nm on the side surface and bottom surface of U-groove 50 by thermal oxidation. This thermal oxidation process is performed similarly to the above described thermal oxidation process illustrated in FIG. 14.

In this thermal oxidation process, since the back surface of wafer 21 is covered with oxide film 601 and polycrystalline silicon film 41, the scattering of impurities within semiconductor substrate 1 to the outside of wafer 21 can be prevented, with the result that channel 5 of any wafer 21 in an oxidation furnace is prevented from being doped with impurities. Further, by this process, the surface of polycrystalline silicon film 41 is oxidized and an oxide film 671 is formed thereon. The reference numeral 67 denotes an oxide film grown at the wafer surface.

Figure 16:
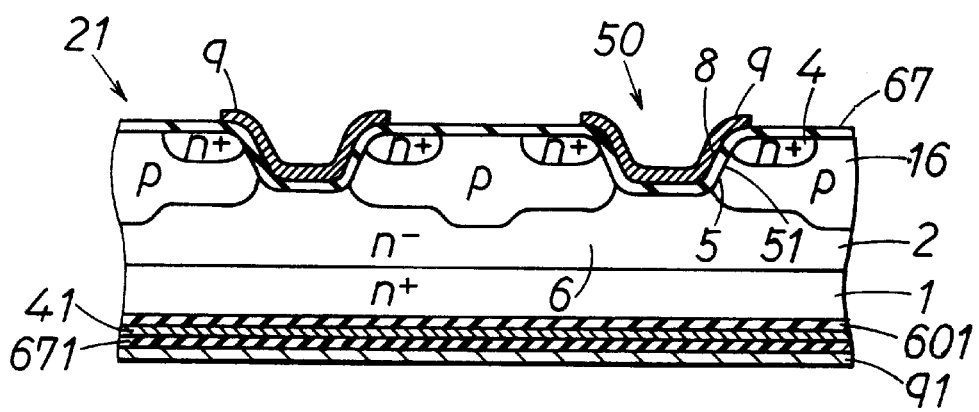

Now, as illustrated in FIG. 16, a polycrystalline silicon film is deposited on the main surface of wafer 21 to a thickness of approximately 400 nm. In the same way, a polycrystalline silicon film 91 is deposited on the back surface of wafer 21. Further, the polycrystalline silicon film on the main surface of wafer 21 is patterned so that a gate electrode 9 is formed.

Figure 17:
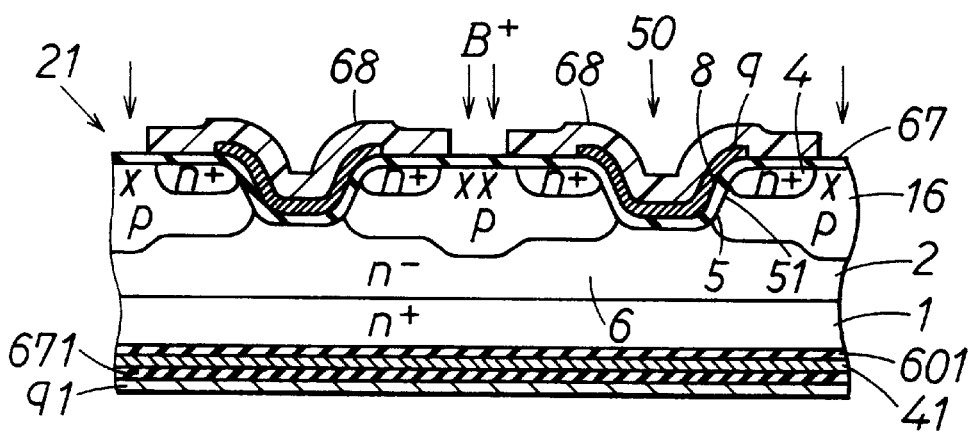

As illustrated in FIG. 17, boron ions are implanted through oxide film 67 by using a patterned photoresist film 68 as a mask to form a $p^+$-type body contact region 17.

Figure 18:
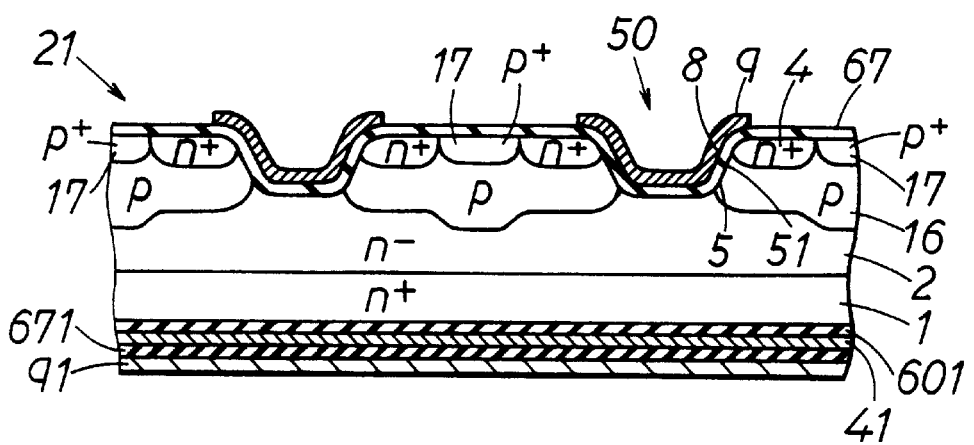

Following the above, as illustrated in FIG. 18, $p^+$-type body contact region 17 is formed to a junction depth of approximately 0.5 μm by thermal diffusion.

Then, as illustrated in FIG. 1B, an interlayer insulating film 18 is formed with BPSG on the main surface of wafer 21 and contact holes a re made in parts of interlayer insulating film 18 to expose $p^+$-type body contact region 17 and $n^+$-type source region 4.

Furthermore, a source electrode 19 is formed with an aluminum film and ohmic contact is made between source electrode 19 and $p^+$-type body contact region 17 and $n^+$-type source region 4 through the contact hole. Subsequently, a passivation film (not illustrated) is formed with silicon nitride, etc. for protecting the aluminum film by a plasma enhanced CVD (chemical vapor deposition) technique or the like. The back surface of wafer 21 are ground by means of surface-grinding method or lapping method to remove the by-product layers, i.e., oxide film 601, polycrystalline silicon film 41, oxide film 671 and polycrystalline silicon film 9 1 so that semiconductor substrate 1 is exposed. Then, a drain electrode 20 with three layers of a Ti film, a Ni film and a Au film is formed on the as-ground back surface of semiconductor substrate 1, and an ohmic contact is made between drain electrode 20 and $n^+$-type semiconductor substrate 1 to obtain a structure illustrated in FIGS. 1A and 1B.

According to the present embodiment, since the back surface of semiconductor substrate 1 is covered with oxide film 601 and polycrystalline silicon film 41, the scattering of impurities within semiconductor substrate 1 to the outside can be suppressed in the thermal oxidation process.

In the present embodiment, polycrystalline silicon film 41 is used as a material film which is hardly removed when LOCOS oxide film 65 is removed. Silicon nitride may be used instead of polycrystalline silicon.

According to the present embodiment, phosphorous ions are implanted to form the $n^+$-type source region. In place of the phosphorous ions, antimony having lower vapor pressure can be used. In that case, during the thermal oxidation processes of FIGS. 14 and 15, the vaporization of the impurities from source region 4 can be restrained, and thus undesired introduction of impurities into channel 5 can be suppressed.

According to the above embodiment, the lattice-like pattern is used; however, a stripe-like pattern or the like may also be applied to the present invention.

In addition, the present invention may be applied to a so-called trench gate type vertical MOSFET. More specifically, the present invention may be applied to a MOSFET structure which is formed on a wafer composed of an $n^+$-type semiconductor substrate, an $n^-$-type epitaxial layer, and p-type and $n^+$-type layers formed on the $n^-$-type epitaxial layer by means of epitaxial growth or diffusion and which has a trench formed by means of R.I.E. technique for disposing a gate electrode therein. Namely, an $SiO_2$ film is deposited by CVD method on the $n^+$-type layer surface of the above-mentioned wafer as a mask for forming the trench. At this time, on the back surface of the wafer is deposited an $SiO_2$ film. Subsequently, the trench is formed by means of the well-known R.I.E. technique; however, when the remaining $SiO_2$ mask on the substrate surface is removed after forming the trench, the $SiO_2$ on the back surface of the substrate is concurrently removed. This causes the above-mentioned vaporization and scattering of impurities from the $n^+$ layer (substrate) at the back surface of the wafer during the subsequent gate oxidation process, resulting in undesirable carrier density fluctuation in the channel region. Therefore, a film for preventing the impurity vaporization should be formed at the back surface side of the substrate before removing the $SiO_2$ mask by etching. The present embodiment can solve the problem by depositing a polysilicon film or silicon nitride film before depositing $SiO_2$ which is to be the above-mentioned mask. Accordingly, even if the $SiO_2$ film as a trench mask is removed, or even if the $SiO_2$ film at the back surface is removed simultaneously, by means of the aforementioned polysilicon film or silicon nitride film, the back surface of the substrate is hardly exposed, thereby preventing such problem as above. Further, if the silicon nitride film is employed as such film, the silicon nitride film can be applied to a mask material for the gate oxidation.

Further, the present invention should not be limited to a vertical type power MOSFET, but the present invention may also be applied to a power MOS-IC which includes a vertical type power MOSFET, an IGBT (insulating gate type bipolar transistor) or the like.

Furthermore, in the above embodiments, description has been given only to the n-channel type, it is needless to say that the p-channel type can obtain the same effect as the n-channel type.

Furthermore, in the above embodiments, description has been given in the vertical power element structure, but the present invention may also be applied to the lateral type power element structure, which can also obtain the same effect as the vertical power element structure. In this case, the back surface thereof is highly doped, though the drain electrode thereof is disposed on the main surface of the semiconductor substrate.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A manufacturing method of a semiconductor device, comprising the steps of:

preparing a wafer having a semiconductor substrate of a high impurity concentration and a first conductivity type semiconductor layer of a lower impurity concentration than that of said semiconductor substrate;

forming a local oxide film by locally oxidizing a specified region of a main surface of said semiconductor layer of said wafer;

forming a second conductivity type body region and a first conductivity type source region by double-diffusion using said local oxide film as a mask, whereby a channel region is defined at a surface of said body region to which a side part of said local oxide film faces;

forming a concavity at said main surface of said semiconductor layer by removing said local oxide film;

forming an insulated gate structure by thermally oxidizing an inner wall of said concavity including a part to be said channel region to form a gate oxide film and disposing a gate electrode thereon; and after said double-diffusion and prior to said removing of said local oxide film, covering a back surface side of said semiconductor substrate with a material film unremovable when said local oxide film is removed.

2. A method according to claim 1, wherein said covering step includes covering said back surface side of said semiconductor substrate with polycrystalline silicon or silicon nitride as said material film.

3. A method according to claim 1, further comprising the steps of:

exposing said semiconductor substrate from said back surface side thereof by removing said material film; and forming a drain electrode on said exposed semiconductor substrate.

4. A method according to claim 1, w herein said source region is formed by using antimony.

5. A manufacturing method of a semiconductor device, comprising the steps of:

preparing a wafer having a semiconductor substrate of a high impurity concentration and a first conductivity type semiconductor layer of a lower impurity concentration than that of said semiconductor substrate;

forming a local oxide film by locally oxidizing a specified region of a main surface of said semiconductor layer of said wafer;

forming a second conductivity type body region and a first conductivity type source region by double-diffusion using said local oxide film as a mask, whereby a channel region is defined at a surface of said body region to which a side part of said local oxide film faces;

forming a concavity at said main surface of said semiconductor layer by removing said local oxide film;

forming an insulated gate structure by thermally oxidizing an inner wall of said concavity including a part to be said channel region to form a gate oxide film and disposing a gate electrode thereon; and after said double-diffusion and prior to said removing of said local oxide film, forming at a back surface side of said semiconductor substrate a film capable of preventing an impurity vaporization from said back surface side of said semiconductor substrate during said thermal oxidation.

6. A method according to claim 5, further comprising the steps of:

exposing said semiconductor substrate from s aid back surface side thereof by removing said film; and forming a drain electrode on said exposed semiconductor substrate.

7. A method according to claim 5, w herein said source region is formed by using antimony.

8. A manufacturing method of a semiconductor device, comprising the steps of:

defining a channel region by disposing, on a semiconductor substrate having a first conductivity type semiconductor layer of low impurity concentration, a second conductivity type body region and a first conductivity type source region, a back surface of the semiconductor substrate having a high impurity concentration;

after defining the channel region, covering the back surface of said semiconductor substrate with masking material;

after covering the back surface, forming a gate insulating film by oxidizing a surface of said channel region; and after forming the gate insulating film, disposing a gate electrode at least over said channel region with said gate insulating film interposed therebetween.

9. A method according to claim 8, further comprising a step of removing said masking material at least after said step of forming a gate insulating film.

10. A method according to claim 9, wherein said step of removing said masking material includes grinding a side of said back surface of said semiconductor substrate to thereby expose said semiconductor substrate.

11. A method according to claim 10, further comprising a step of forming a drain electrode on said ground surface of said semiconductor substrate.

12. A method according to claim 8, wherein said step of defining said channel region includes the steps of:

preparing a wafer having said semiconductor substrate and said semiconductor layer disposed on said semiconductor substrate;

forming a local oxide film by locally oxidizing a specified region of a main surface of said semiconductor layer of said wafer; and forming said body region and said source region by double-diffusion using said local oxide film as a mask, whereby said channel region is defined at a surface of said body region to which a side part of said local oxide film faces.

13. A method according to claim 12, wherein said step of forming said gate insulating film includes the steps of:

forming a concavity at said main surface of said semiconductor layer by removing said local oxide film; and thermally oxidizing an inner wall of said concavity to thereby form said gate insulating film.

14. A method according to claim 13, wherein said step of covering said back surface of said semiconductor substrate includes the steps of:

depositing on said wafer said masking material; and selectively removing said masking material deposited over said main surface of said semiconductor layer of said wafer.

15. A method according to claim 14, wherein said selectively removing step includes performing a reactive ion etching.

16. A method according to claim 13, wherein said masking material comprises a material unremovable when said local oxide film is removed.

17. A method according to claim 16, wherein said masking material comprises polycrystalline silicon or silicon nitride.

18. A method according to claim 8, wherein said source region is formed by using antimony.

19. A method according to claim 12, wherein said source region is formed by using antimony.

* * * * *